US012796291B2

(12) United States Patent
Hur

(10) Patent No.: US 12,796,291 B2
(45) Date of Patent: Nov. 10, 2026

(54) DISPLAY DEVICE

(71) Applicant: Samsung Display Co., LTD., Yongin-si (KR)

(72) Inventor: Sungmin Hur, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 308 days.

(21) Appl. No.: 18/756,113

(22) Filed: Jun. 27, 2024

(65) Prior Publication Data

US 2025/0133937 A1 Apr. 24, 2025

(30) Foreign Application Priority Data

Oct. 19, 2023 (KR) ........................ 10-2023-0140259

(51) Int. Cl.
*H10K 59/80* (2023.01)

(52) U.S. Cl.
CPC .................................. *H10K 59/873* (2023.02)

(58) Field of Classification Search
CPC ...... H10K 59/873; H10K 59/12; H10K 59/40; H10K 59/8731; H10K 59/1213; H10K 59/123; H10K 77/10; H10K 2102/351
See application file for complete search history.

(56) References Cited

U.S. PATENT DOCUMENTS

2011/0163330 A1* 7/2011 Kim .................. H10K 59/8731 257/E51.018
2015/0069372 A1* 3/2015 Kim ..................... H10K 50/844 257/40
2015/0333293 A1* 11/2015 Poon .................. H10K 59/8731 438/26
2019/0019983 A1* 1/2019 Kim ..................... H10K 59/131
2019/0036085 A1* 1/2019 Won ...................... C23C 16/345
2019/0250317 A1* 8/2019 Choi .................... G02B 5/3016
2020/0161583 A1* 5/2020 Paek ....................... H10K 59/38

FOREIGN PATENT DOCUMENTS

JP 5544086 7/2014
KR 10-2020-0100513 8/2020
KR 10-2021-0057884 5/2021

* cited by examiner

*Primary Examiner* — S M Sohel Imtiaz

(57) ABSTRACT

A display device includes a transistor disposed on a substrate, a light emitting diode electrically connected to the transistor, a first inorganic encapsulation layer disposed on the light emitting diode, an organic encapsulation layer, a second inorganic encapsulation layer disposed on the organic encapsulation layer, the second inorganic encapsulation layer includes a first sub-layer disposed on the organic encapsulation layer, and a second inorganic encapsulation layer disposed on the first sub-layer, and a second sub-layer, a density of the first sub-layer is lower than a density of the second sub-layer, and the thickness of the first sub-layer is in a range of about 800 angstroms to about 1200 angstroms.

20 Claims, 9 Drawing Sheets

DISPLAY DEVICE

CROSS-REFERENCE TO RELATED APPLICATION(S)

This application claims priority to and benefits of Korean Patent Application No. 10-2023-0140259 under 35 U.S.C. § 119 filed in the Korean Intellectual Property Office on Oct. 19, 2023, the entire contents of which are incorporated herein by reference.

BACKGROUND

1. Technical Field

This disclosure relates to a display device.

2. Description of the Related Art

A display device may include pixels and may display an image on a display screen by controlling the brightness of each pixel.

The display device may include a touch sensor capable of detecting a user's touch.

The display device may include a display panel on which pixels are formed.

The touch sensor may be provided on the display panel.

For example, the display panel may include a touch sensor, or a panel including a touch sensor may be attached to the display panel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are intended to improve the reliability of a display device by providing an inorganic encapsulation layer with hygroscopic properties.

A display device according to an embodiment may include a transistor disposed on a substrate; a light emitting diode electrically connected to the transistor; a first inorganic encapsulation layer disposed on the light emitting diode; an organic encapsulation layer; a second inorganic encapsulation layer disposed on the organic encapsulation layer, wherein the second inorganic encapsulation layer may include a first sub-layer disposed on the organic encapsulation layer; and a second inorganic encapsulation layer disposed on the first sub-layer; and a second sub-layer, wherein a density of the first sub-layer is lower than a density of the second sub-layer, and the thickness of the first sub-layer is in a range of about 800 angstroms to about 1200 angstroms.

The second sub-layer may have a thickness in a range of about 6000 angstroms to about 7000 angstroms.

The first sub-layer and the second sub-layer may be made of a same material.

The first sub-layer may further include oxygen (O).

The first sub-layer may include an amount of oxygen greater than an amount of oxygen included in the second sub-layer.

The first sub-layer may include a moisture adsorption amount greater than a moisture adsorption amount of the second sub-layer.

The first inorganic encapsulation layer may include silicon oxynitride, and the first sub-layer and the second sub-layer may include silicon nitride.

The upper surface of the organic encapsulation layer may include an uneven surface.

The first sub-layer may cover the uneven surface of the upper surface of the organic encapsulation layer.

The upper surface of the first sub-layer may include an uneven surface.

A display device according to an embodiment may include a transistor disposed on a substrate; a light emitting diode electrically connected to the transistor; a first inorganic encapsulation layer disposed on the light emitting diode; an organic encapsulation layer and a second inorganic encapsulation layer disposed on the organic encapsulation layer, wherein the second inorganic encapsulation layer may include a first sub-layer disposed on the organic encapsulation layer, and a second inorganic encapsulation layer disposed on the first sub-layer; a second sub-layer, a density of the first sub-layer is lower than a density of the second sub-layer, and a moisture adsorption amount of the first sub-layer is about $1\times10^{15}$ molecule/cm$^2$ or more.

The first sub-layer may include a thickness in a range of about 800 angstroms to about 1200 angstroms.

The second sub-layer may include a thickness in a range of about in a range of about 6000 angstroms to about 7000 angstroms.

The first sub-layer and the second sub-layer may be made of a same material.

The first sub-layer may further include oxygen (O).

The first inorganic encapsulation layer may include silicon oxynitride, and the first sub-layer and the second sub-layer may include silicon nitride.

The upper surface of the organic encapsulation layer may include an uneven surface, and the first sub-layer may cover the uneven surface.

An upper surface of the first sub-layer may include an uneven surface.

According to embodiments, since the hygroscopicity of the inorganic encapsulation layer included in the display device is improved, the reliability of the display device may be improved by blocking a moisture permeation path caused by external air or moisture permeation.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
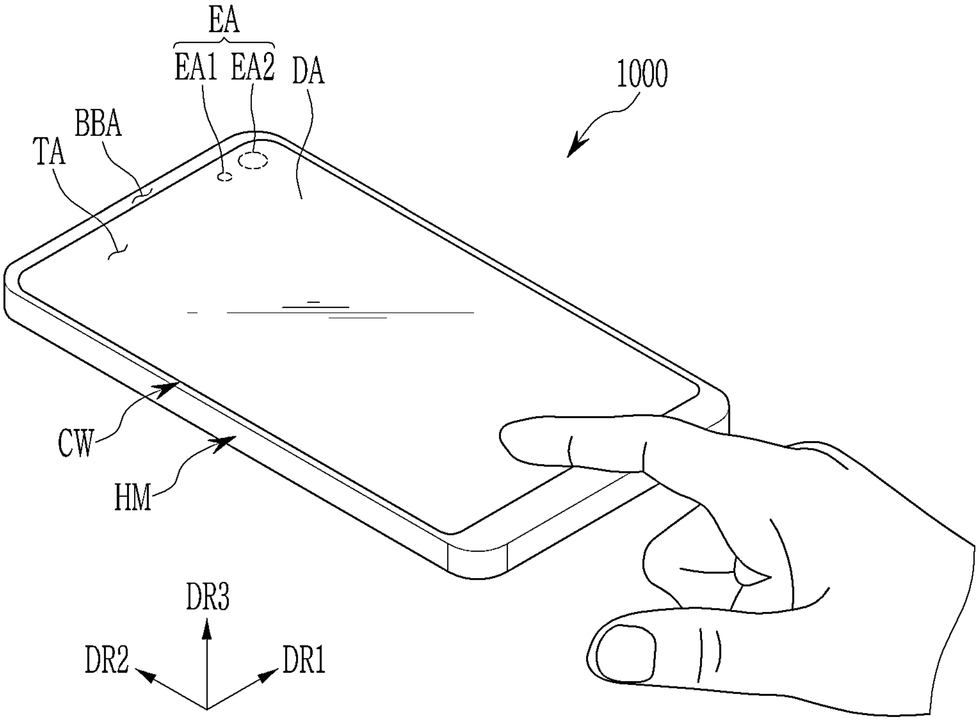
FIG. 1 is a schematic perspective view illustrating a use state of a display device according to an embodiment.

Hereinafter, with reference to the attached drawings, various embodiments will be described in detail so that those skilled in the art may readily implement the disclosure.

The disclosure may be implemented in many different forms and is not limited to the embodiments described herein.

In order to clearly explain the disclosure, parts that are not relevant to the description may be omitted, and identical or similar components are assigned the same reference numerals throughout the specification.

In addition, the size and thickness of each component shown in the drawings are arbitrarily shown for convenience of explanation, thus, the disclosure is not necessarily limited to that which is shown.

In the drawings, the thickness is enlarged to clearly express various layers and areas.

And in the drawings, for convenience of explanation, the thicknesses of some layers and regions are exaggerated.

Additionally, when a part of a layer, membrane, region, plate, etc. is said to be "above" or "on" another part, this includes not only cases where it is "directly above" another part, but also cases where there is another part in between.

Conversely, when a part is said to be "right on top" of another part, it means that there is no other part in between.

In addition, being "above" or "on" a reference part means being disposed above or below the reference part, and does not necessarily mean being disposed "above" or "on" it in the direction opposite to gravity.

In addition, throughout the specification, when a part is said to "include" a certain component, this means that it may further include other components rather than excluding other components, unless specifically stated to the contrary.

In addition, throughout the specification, when reference is made to "on a plane," this means when the target portion is viewed from above, and when reference is made to "in cross-section," this means when a cross-section of the target portion is cut vertically and viewed from the side.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "comprises," "comprising," "includes," and/or "including," "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Below, the schematic structure of the display device through FIGS. 1 and 2 will be examined.

Figure 2:
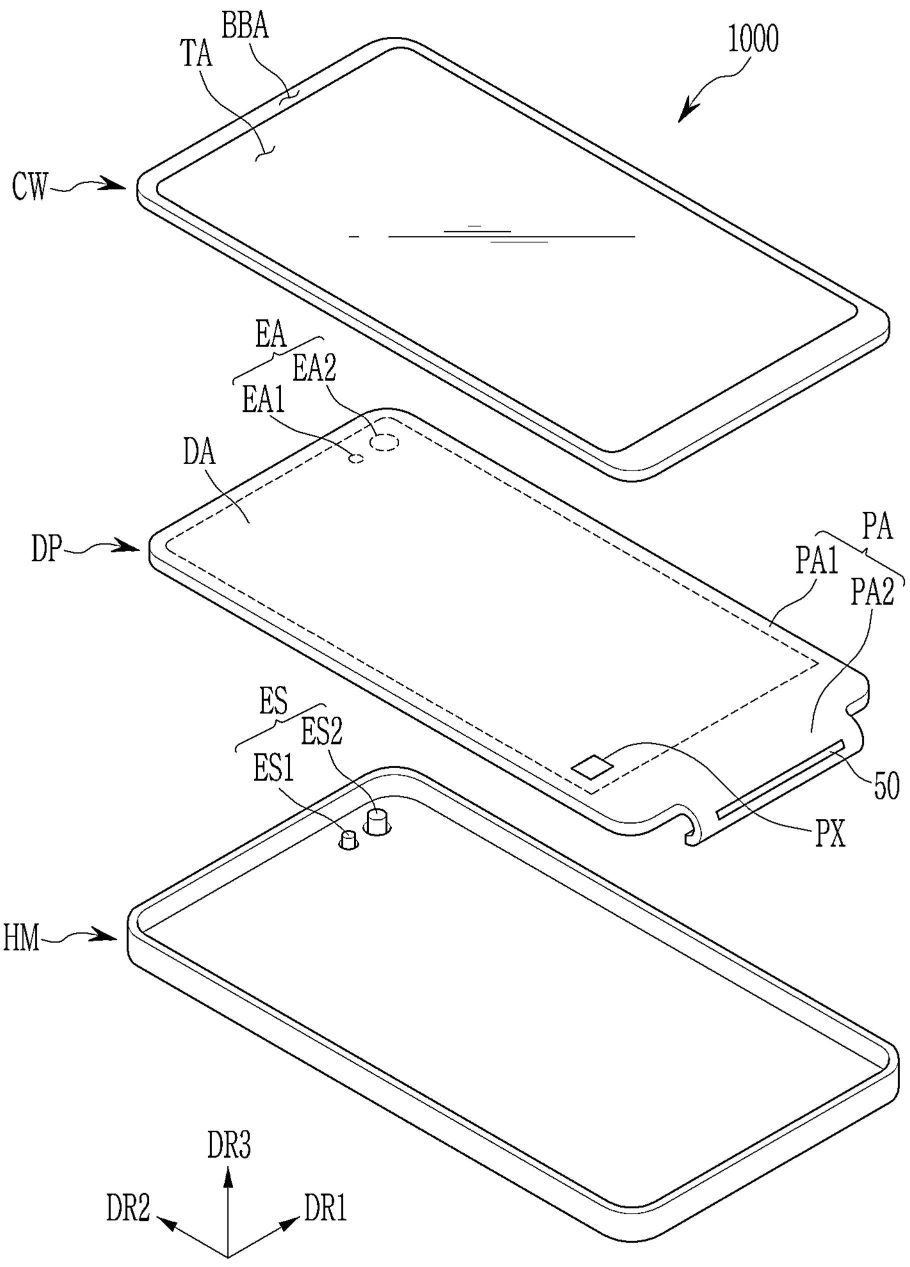
FIG. 2 is an exploded perspective view of a display device according to an embodiment.

FIG. 1 is a schematic perspective view showing a use state of a display device according to an embodiment, and FIG. 2 is an exploded perspective view of a display device according to an embodiment.

Referring to FIG. 1, a display device 1000 according to an embodiment is a device that displays moving images or still images, and may be used in mobile phones, smart phones, or tablet personal computers, not only portable electronic devices such as communication terminals, electronic notebooks, e-books, portable multimedia players (PMP), navigation, and ultra mobile PCs (UMPC), but also may be used as a display screen for various products such as televisions, laptops, monitors, billboards, internet of things (IOT), etc.

The display device 1000 according to an embodiment may be mounted on a wearable device such as a smart watch, a watch phone, a glasses-type display, or a head mounted display (HMD).

The display device 1000 according to an embodiment may include a dashboard of a car, a center information display (CID) placed on the center fascia or dashboard of a car, or a room mirror display (a display instead of a side mirror of a car), may be used as entertainment for the back seat of a car, and as a display placed on the back of the front seat.

FIG. 1 shows the display device 1000 being used as a smart phone, for convenience of explanation.

The display device 1000 may display an image in the third direction DR3 on a display surface parallel to each of the first direction DR1 and the second direction DR2.

The display surface on which the image is displayed may correspond to the front surface of the display device 1000 and the front surface of the cover window CW.

Images may include static images as well as dynamic images.

In this embodiment, the front (or top) and back (or bottom) surfaces of each member are defined based on the direction in which the image is displayed.

The front and back surfaces are opposed to each other in the third direction DR3, and the normal directions of each of the front and back surfaces may be parallel to the third direction DR3.

The separation distance between the front and back surfaces in the third direction DR3 may correspond to the thickness of the display panel in the third direction DR3.

The display device 1000 according to an embodiment may detect a user's input (refer to the hand in FIG. 1) applied from the outside.

The user's input may include various types of external inputs, such as parts of the user's body, light, heat, or pressure.

In an embodiment, the user's input is shown with the user's hand applied to the front.

However, the disclosure is not limited thereto.

The user's input may be provided in various forms, and the display device 1000 may also detect the user's input applied to the side or back of the display device 1000 depending on the structure of the display device 1000.

Referring to FIGS. 1 and 2, the display device 1000 may include a cover window CW, a housing HM, a display panel DP, and an optical element ES.

In an embodiment, the cover window CW and the housing HM may be combined to form the exterior of the display device 1000.

The cover window CW may include an insulating panel.

For example, the cover window CW may be made of glass, plastic, or a combination thereof.

The front of the cover window CW may define the front of the display device 1000.

A transmission area TA may be an optically transparent area.

For example, the transmission area TA may be an area with a visible light transmittance of about 90% or more.

A blocking area BBA may define the shape of the transmission area TA.

The blocking area BBA is adjacent to the transmission area TA and may surround the transmission area TA.

The blocking area BBA may be an area with relatively low light transmittance compared to the transmission area TA.

The blocking area BBA may include an opaque material that blocks light.

The blocking area BBA may have a selectable color.

The blocking area BBA may be defined by a bezel layer provided separately from the transparent substrate defining the transparent area TA, or may be defined by an ink layer formed by inserting or coloring the transparent substrate.

The display panel DP may include a display pixel PX that displays an image and a driver 50, and the display pixel PX is disposed in the display area DA and a component area EA.

The display panel DP may include a front surface including a display area DA and a non-display area PA.

In an embodiment, the display area DA and component area EA are areas where images are displayed, including pixels, and at the same time, they may be areas where external input is detected with a touch sensor disposed in the third direction DR3 of the pixels.

The transmission area TA of the cover window CW may at least partially overlap the display area DA and the component area EA of the display panel DP.

For example, the transmission area TA may overlap the front surface of the display area DA and the component area EA, or may overlap at least a portion of the display area DA and the component area EA.

Accordingly, the user may view an image through the transmission area TA or provide external input based on the image.

However, the disclosure is not limited thereto.

For example, the area where an image is displayed and the area where external input is detected may be separated from each other.

The non-display area PA of the display panel DP may at least partially overlap the blocking area BBA of the cover window CW.

The non-display area PA may be an area covered by the blocking area BBA.

The non-display area PA is adjacent to the display area DA and may surround the display area DA.

An image is not displayed in the non-display area PA, and a driving circuit or driving wiring for driving the display area DA may be disposed.

The non-display area PA may include a first non-display area PA1 disposed outside the display area DA and a second non-display area PA2 including a driver 50, connection wiring, and a bending area.

In the embodiment of FIG. 2, the first non-display area PA1 is disposed on the third side of the display area DA, and the second non-display area PA2 is disposed on the remaining side of the display area DA.

A portion of the non-display area PA of the display panel DP may be curved.

At this time, part of the non-display area PA is directed toward the rear of the display device 1000, so that the blocking area BBA visible on the front of the display device 1000 may be reduced. In FIG. 2, the second non-display area PA2 may be bent and placed on the back of the display area DA and assembled.

Additionally, the component area EA of the display panel DP may include a first component area EA1 and a second component area EA2.

The first component area EA1 and the second component area EA2 may be at least partially surrounded by the display area DA.

The first component area EA1 and the second component area EA2 are shown spaced apart from each other, but are not limited to this and may be at least partially connected.

The first component area EA1 and the second component area EA2 may be areas in which an optical element (see ES in FIG. 2; hereinafter referred to as a component) that uses infrared rays, visible rays, or sound is disposed.

The display area (DA; hereinafter also referred to as the main display area) and the component area EA are formed with a plurality of light emitting diodes and a plurality of pixel circuit parts that generate and transmit light emission current to each of the plurality of light emitting diodes.

Here, one light emitting diode and one pixel circuit part are called a pixel (PX).

One pixel circuit part and one light emitting diode may be formed in a one-to-one ratio in the display area DA and the component area EA.

The first component area EA1 may include a display layer including a plurality of pixels and a transmission portion through which light and/or sound may pass.

The transmission portion is disposed between adjacent pixels and is composed of a layer through which light and/or sound may pass.

The transmission portion may be disposed between adjacent pixels, and depending on the embodiment, a layer that does not transmit light, such as a light blocking member, may overlap the first component area EA1.

The number of pixels (hereinafter referred to as resolution) per unit area of the pixels (hereinafter referred to as normal pixels) included in the display area DA and the pixels included in the first component area (EA1) (hereinafter referred to as first component pixels) may be the same.

The second component area EA2 may include an area composed of a transparent layer so that light may pass through (hereinafter also referred to as a light transmission area), and the light transmission area does not have a conductive layer or a semiconductor layer and may include a light blocking material. The layer—for example, the pixel defining layer and/or the light blocking member—may have a structure that does not block light by including an opening that overlaps a position corresponding to the second component area EA2.

The number of pixels per unit area of the pixels included in the second component area EA2 (hereinafter also referred to as second component pixels) may be smaller than the number of pixels per unit area of the normal pixels included in the display area DA.

As a result, the resolution of the second component pixels may be lower than that of normal pixels.

The second non-display area PA2 may include a bending portion.

The display area DA and the first non-display area PA1 may have a flat state substantially parallel to the plane defined by the first direction DR1 and the second direction DR2, and the second non-display area PA1 may have a flat state. One side or a side of the display area PA2 may extend from a flat state, pass through a bending portion, and return to a flat state.

As a result, at least a portion of the second non-display area PA2 may be bent and assembled to be disposed on the rear side of the display area DA.

In case that at least a portion of the second non-display area PA2 is assembled, it overlaps the display area DA on a plane, so the blocking area BBA of the display device 1000 may be reduced.

The driver 50 may be mounted on the second non-display area PA2, on the bending portion, or disposed on one of both sides of the bending portion.

The driver 50 may be provided in the form of a chip.

The driver 50 is electrically connected to the display area DA and the component area EA and may transmit electrical signals to pixels in the display area DA and the component area EA.

For example, the driver 50 may provide data signals to the pixels PX arranged or disposed in the display area DA.

By way of example, the driver 50 may include a touch driving circuit and may be electrically connected to the touch sensing unit (or part) TS disposed in the display area DA and/or the component area EA.

The driver 50 may include various circuits in addition to the above-described circuits or may be designed to provide various electrical signals to the display area DA.

The display device 1000 may have a pad part disposed at the end of the second non-display area PA2, and may be electrically connected to a flexible printed circuit board (FPCB) including a driving chip by the pad part.

Here, the driving chip disposed on the flexible printed circuit board may include various driving circuits for driving the display device 1000 or a connector for power supply.

Depending on the embodiment, a rigid printed circuit board (PCB) may be used instead of a flexible printed circuit board.

An optical element ES may be disposed below the display panel DP.

The optical element ES may include a first optical element ES1 overlapping the first component area EA1 and a second optical element ES2 overlapping the second component area EA2.

The first optical element ES1 may use infrared rays, and in this case, in the first component area EA1, a layer that does not transmit light, such as a light blocking member, may overlap the first component area EA1.

The first optical element ES1 may be an electronic element that uses light or sound.

For example, the first optical element ES1 is a sensor that receives and uses light such as an infrared sensor, a sensor that outputs and detects light or sound to measure distance or recognize a fingerprint, etc., a small lamp that outputs light, or a speaker that outputs sound.

Of course, in the case of electronic elements that use light, light of various wavelength bands, such as visible light, infrared light, and ultraviolet light, may be used.

The second optical device ES2 may be at least one of a camera, an infrared camera (IR camera), a dot projector, an infrared illuminator (IR illuminator), and a time-of-flight sensor (ToF sensor, time-of-flight sensor).

The housing HM may be combined with the cover window CW.

The cover window CW may be placed on the front of the housing HM.

The housing HM may be combined with the cover window CW to provide a selectable accommodation space.

The display panel DP and the optical element ES may be accommodated in a selectable accommodation space provided between the housing HM and the cover window CW.

The housing HM may include a material with relatively high rigidity.

For example, the housing HM may include a plurality of frames and/or plates made of glass, plastic, or metal, or a combination thereof.

The housing HM may stably protect the components of the display device 1000 accommodated in the internal space from external shock.

Hereinafter, the structure of the display device 1000 according to an embodiment will be illustrated through FIG. 3.

Figure 3:
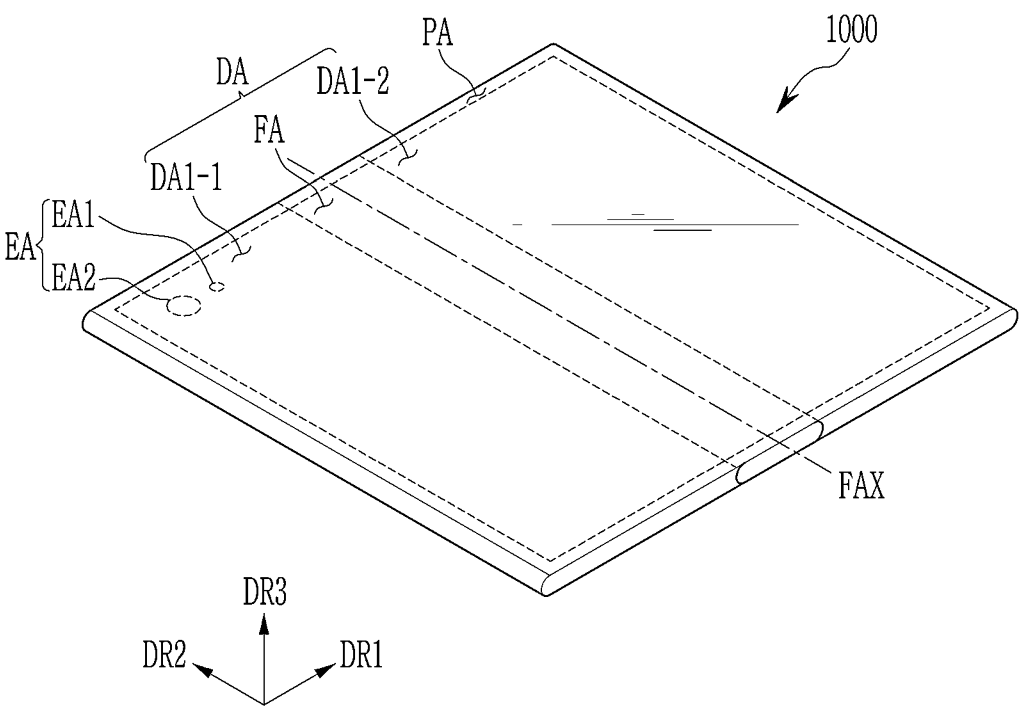
FIG. 3 is a schematic perspective view schematically showing a display device according to an embodiment.

FIG. 3 is a schematic perspective view schematically showing a light emitting display device according to an embodiment.

Descriptions of the same components as those described above will be omitted, and the embodiment of FIG. 3 shows a foldable display device in which the display device 1000 is folded through the folding axis FAX.

Referring to FIG. 3, in an embodiment, the display device 1000 may be a foldable display device.

The display device 1000 may be folded outward or inward based on the folding axis FAX.

In case that folded outward based on the folding axis FAX, the display surfaces of the display device 1000 are positioned on the outside in the third direction DR3 so that images may be displayed in both directions.

If the display surface is folded inward based on the folding axis FAX, it may not be visible from the outside.

In an embodiment, the display device 1000 may include a display area DA, a component area EA, and a non-display area PA.

The display area DA may be divided into a 1-1 display area DA1-1, a 1-2 display area DA1-2, and a folding area FA.

The first display area (DA1-1) and the second display area (DA1-2) may be disposed on the left and right, respectively, based on (or, centered around) the folding axis FAX, and a folding area (FA) may be disposed between the first display area (DA1-1) and the second display area (DA1-2).

At this time, in case that folded outward based on the folding axis FAX, the 1-1 display area (DA1-1) and the 1-2 display area (DA1-2) are disposed on both sides in the third direction (DR3), which allows images to be displayed in both directions.

Additionally, in case that folded inward based on the folding axis FAX, the 1-1 display area DA1-1 and the 1-2 display area DA1-2 may not be visible from the outside.

Hereinafter, a display panel according to an embodiment will be described with reference to FIGS. 4 to 6.

Figure 4:
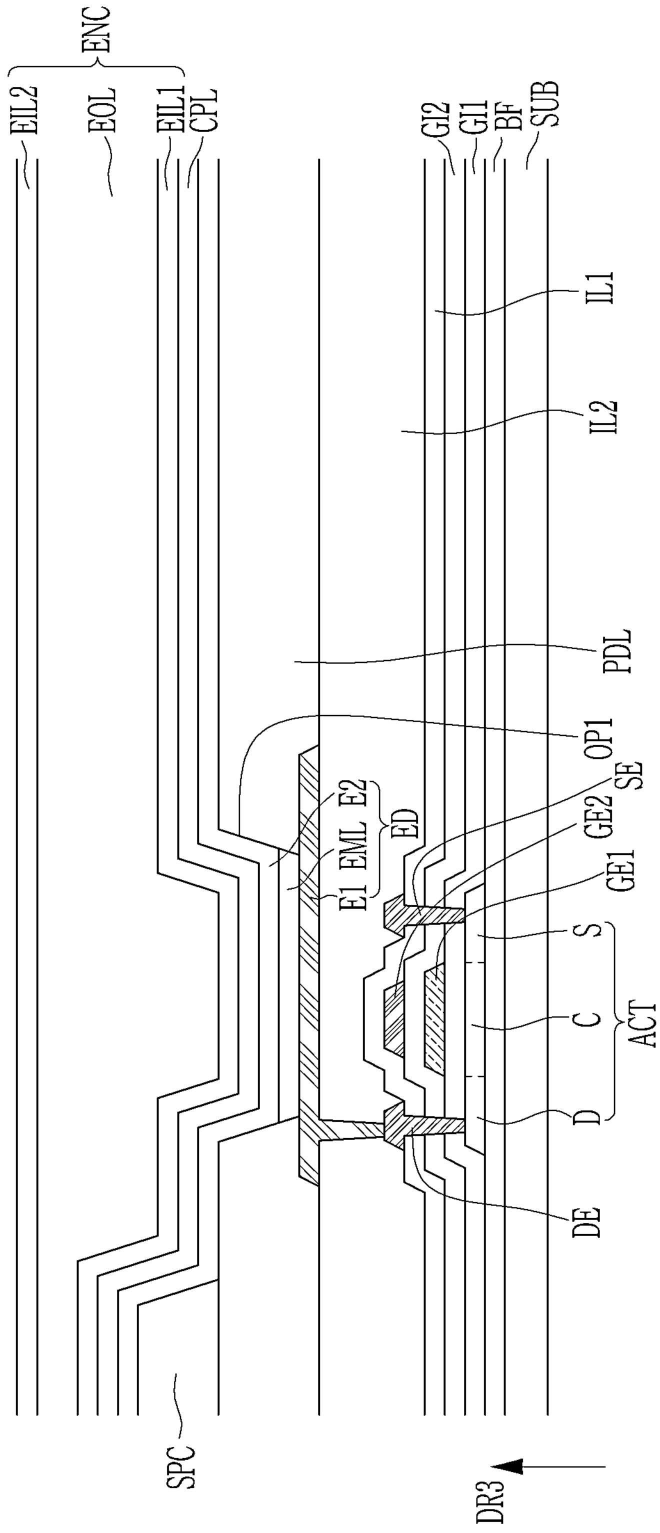
FIG. 4 is a schematic cross-sectional view of a portion of a display panel according to an embodiment.
Figure 5:
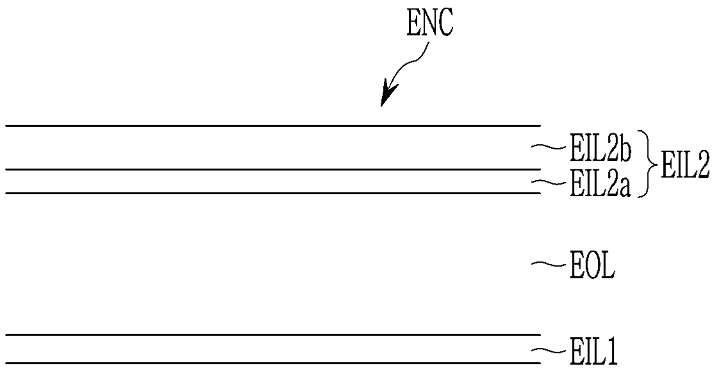
FIG. 5 is a schematic cross-sectional view showing an encapsulation layer according to an embodiment.
Figure 6:
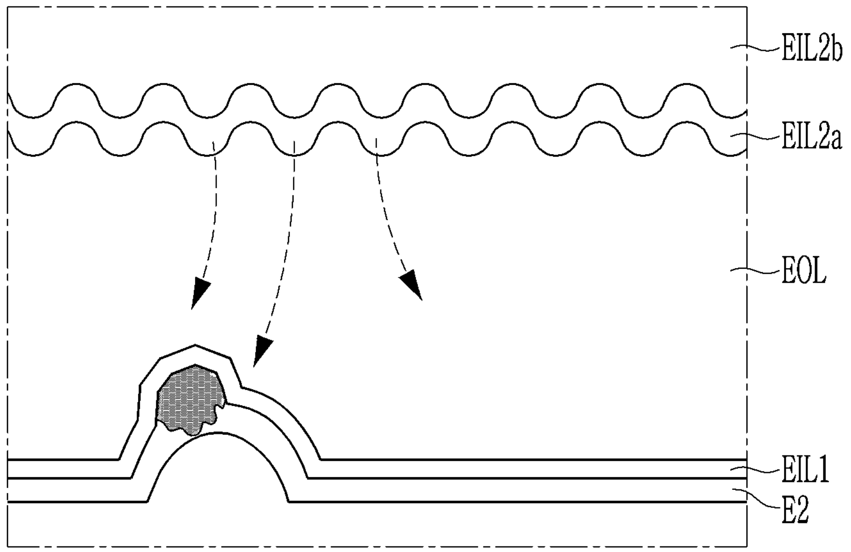
FIG. 6 is a diagram schematically showing a moisture permeation path of external air in an embodiment.

FIG. 4 is a schematic cross-sectional view of a portion of a display panel according to an embodiment, FIG. 5 is a schematic cross-sectional view showing an encapsulation layer according to an embodiment, and FIG. 6 is a diagram schematically showing a moisture permeation path of external air according to an embodiment.

First, referring to FIG. 4, the substrate SUB may include a material with rigid properties such as glass or a flexible material that may be bent such as plastic or polyimide.

A buffer layer BF may be further positioned on the substrate SUB to flatten the surface of the substrate SUB and block penetration of impure elements.

The buffer layer BF may include an inorganic material—for example, an inorganic insulating material such as silicon nitride ($SiN_x$), silicon oxide ($SiO_x$), or silicon nitride ($SiO_xN_y$).

Depending on the embodiment, the buffer layer BF may have a single-layer or multi-layer structure including one or more inorganic insulating materials.

A barrier layer (not shown) may be further positioned on the substrate SUB.

At this time, the barrier layer may be disposed between the substrate SUB and the buffer layer BF.

The barrier layer may include an inorganic insulating material such as silicon nitride ($SiN_x$), silicon oxide ($SiO_x$), or silicon nitride ($SiO_xN_y$).

The barrier layer (not shown) may have a single-layer or multi-layer structure containing one or more inorganic insulating materials.

The semiconductor layer ACT may be disposed on the substrate SUB.

The semiconductor layer ACT may include any one of amorphous silicon, polycrystalline silicon, and an oxide semiconductor.

For example, the semiconductor layer ACT may include low-temperature polysilicon (LTPS) or an oxide semiconductor that may include at least one of zinc (Zn), indium (In), gallium (Ga), tin (Sn) and their mixtures.

For example, the semiconductor layer ACT may include indium-gallium-zinc oxide (IGZO).

The semiconductor layer ACT may include a channel region (C), a source region(S), and a drain region (D) that are divided depending on whether or not the semiconductor layer is doped with impurities.

The source region(S) and drain region (D) may have conductive characteristics corresponding to the conductors.

The first gate insulating layer GI1 may cover the semiconductor layer ACT and the substrate SUB.

The first gate insulating layer GI1 may include an inorganic insulating material such as silicon nitride ($SiN_x$), silicon oxide ($SiO_x$), or silicon nitride ($SiO_xN_y$).

The first gate insulating layer GI1 may have a single-layer or multi-layer structure containing one or more inorganic insulating materials.

The gate electrode GE1 may be positioned on the first gate insulating layer GI1.

The gate electrode GE1 may contain a metal or metal alloy such as copper (Cu), molybdenum (Mo), aluminum (Al), silver (Ag), chromium (Cr), tantalum TA, and titanium (Ti).

The gate electrode GE1 may be composed of a single layer or multiple layers.

A region of the semiconductor layer ACT that overlaps the planar gate electrode GE may be a channel region (C).

The second gate insulating layer GI2 is disposed on the gate electrode GE1.

The second gate insulating layer (GI2) may include inorganic insulating materials such as silicon nitride ($SiN_x$), silicon oxide ($SiO_x$), silicon oxynitride ($SiO_xN_y$), etc.

The second gate insulating layer GI2 may have a single-layer or multi-layer structure including one or more inorganic insulating materials.

A capacitor electrode GE2 may be positioned on the second gate insulating layer GI2.

The capacitor electrode GE2 may overlap the gate electrode GE1 to form a capacitor.

The first insulating layer IL1 is disposed on the capacitor electrode GE2.

The first insulating layer IL1 may include an inorganic insulating material such as silicon nitride ($SiN_x$), silicon oxide ($SiO_x$), or silicon nitride ($SiO_xN_y$).

The first insulating layer IL1 may have a single-layer or multi-layer structure including one or more inorganic insulating materials.

The source electrode SE and the drain electrode DE may be positioned on the first insulating layer IL1.

The source electrode SE and the drain electrode DE are connected to the source region(S) of the semiconductor layer ACT by openings formed in the first insulating layer (IL1), the second gate insulating layer (GI2), and the first gate insulating layer (GI1) and the drain region (D), respectively.

Accordingly, the above-described semiconductor layer ACT, the gate electrode GE, the source electrode SE, and the drain electrode DE form one transistor.

Depending on the embodiment, a transistor TFT may include only the source and drain regions of the semiconductor layer ACT instead of the source electrode SE and drain electrode DE.

The source electrode SE and drain electrode DE may include aluminum (Al), copper (Cu), silver (Ag), gold (Au), platinum (Pt), palladium (Pd), nickel (Ni), molybdenum (Mo), tungsten (W), titanium (Ti), chromium (Cr), tantalum TA, etc., and may include metals or metal alloys.

The source electrode SE and drain electrode DE may be composed of a single layer or multiple layers.

The source electrode SE and drain electrode DE according to an embodiment may be composed of a triple layer including an upper layer, a middle layer, and a lower layer, and the upper layer and the lower layer may include titanium (Ti), and the middle layer may include aluminum (Al).

The second insulating layer IL2 may be positioned on the source electrode SE and the drain electrode DE.

The second insulating layer IL2 covers the source electrode SE and the drain electrode DE.

The second insulating layer IL2 is used to planarize the surface of the substrate SUB on which the transistor is installed, and may be an organic insulating layer selected from the group consisting of polyimide, polyamide, acrylic resin, benzocyclobutene, and phenolic resin, and it may contain more than one substance.

The first electrode E1 may be positioned on the second insulating layer IL2.

The first electrode E1 is also called an anode electrode and may be composed of a single layer containing a transparent conductive oxide layer or a metal material, or a multiple layer containing these.

The transparent conductive oxide layer may include indium tin oxide (ITO), poly-ITO, indium zinc oxide (IZO), indium gallium zinc oxide (IGZO), and indium tin zinc oxide (ITZO).

Metal materials may include silver (Ag), molybdenum (Mo), copper (Cu), gold (Au), and aluminum (Al).

The first electrode E1 may be physically and electrically connected to the drain electrode DE through an opening in the second insulating layer IL2.

Accordingly, the first electrode E1 may receive the output current to be transmitted from the drain electrode DE to a light emitting layer EML.

A pixel defining layer PDL and a spacer (SPC) may be positioned on the first electrode E1 and the second insulating layer (IL2).

The pixel defining layer PDL may include a pixel opening OP1 that overlaps at least a portion of the first electrode E1.

At this time, the pixel opening OP1 may overlap the center of the first electrode E1 and may not overlap the edge of the first electrode E1.

Accordingly, the size of the opening OP1 may be smaller than the size of the first electrode E1.

The pixel defining layer PDL may define the formation location of the light emitting layer EML so that the light emitting layer EML may be positioned on the exposed portion of the upper surface of the first electrode E1.

The pixel defining layer PDL and spacer (SPC) may be an organic insulating layer containing one or more materials selected from the group consisting of polyimide, polyamide, acrylic resin, benzocyclobutene, and phenol resin, and depending on the embodiment, the pixel defining layer PDL may be formed of a black pixel definition layer (BPDL) containing black pigment.

The light emitting layer EML may be disposed in the pixel opening OP1 partitioned by the pixel defining layer PDL.

The light emitting layer EML may include an organic material that emits light such as red, green, and blue.

The light emitting layer EML, which emits red, green, and blue light, may contain low-molecular or high-molecular organic materials.

In FIG. 4, the light emitting layer EML is shown as a single layer, but in reality, auxiliary layers such as an electron injection layer, an electron transport layer, a hole transport layer, and a hole injection layer may also be included above and below the light emitting layer EML, a hole injection layer and a hole transport layer may be disposed below the EML, and the electron transport layer and the electron injection layer may be disposed above the light emitting layer EML.

The second electrode E2 may be disposed on the pixel defining layer PDL and the light emitting layer EML.

The second electrode E2 is also called a cathode electrode.

Additionally, the second electrode E2 may have translucent characteristics, and in this case, it may form a micro-cavity together with the first electrode E1.

According to the micro-cavity structure, the spacing and characteristics between both electrodes allow light of a selected wavelength to be emitted upward, and as a result, red, green, or blue colors may be displayed.

The encapsulation layer ENC may be positioned on the second electrode E2.

The encapsulation layer ENC may include at least one inorganic layer and at least one organic layer.

In this embodiment, the encapsulation layer ENC may include a first inorganic encapsulation layer EIL1, an organic encapsulation layer EOL, and a second inorganic encapsulation layer EIL2.

However, this is only an example, and the number of inorganic and organic layers constituting the encapsulation layer ENC may be changed in various ways.

Additionally, depending on the embodiment, a capping layer CPL may be positioned between the encapsulation layer ENC and the second electrode E2.

Referring to FIG. 5, the first inorganic encapsulation layer EIL1 according to an embodiment may include an inorganic insulating material such as silicon nitride ($SiN_x$), silicon oxide ($SiO_x$), or silicon oxynitride ($SiO_xN_y$).

The organic encapsulation layer EOL disposed on the first inorganic encapsulation layer EIL1 may include an organic material.

The organic encapsulation layer EOL may include a monomer.

The second inorganic encapsulation layer EIL2 may be positioned on the organic encapsulation layer EOL.

The second inorganic encapsulation layer EIL2 may be disposed directly on the organic encapsulation layer EOL.

The second inorganic encapsulation layer EIL2 may include a first sub-layer EIL2*a* and a second sub-layer EIL2*b*.

The first sub-layer EIL2*a* may be disposed directly above the organic encapsulation layer EOL.

The second sub-layer EIL2*b* may be directly disposed on the first sub-layer EIL2*a*.

The first sub-layer EIL2*a* and the second sub-layer EIL2*b* may include the same inorganic material.

The first sub-layer EIL2*a* and the second sub-layer EIL2*b* may include an inorganic insulating material such as silicon nitride ($SiN_x$), silicon oxide ($SiO_x$), or silicon oxynitride ($SiO_xN_y$). For example, the first sub-layer (EIL2*a*) and the second sub-layer EIL2*b* may include silicon nitride.

The first sub-layer EIL2*a* according to an embodiment may further include oxygen.

Oxygen included in the first sub-layer EIL2*a* may be oxygen absorbed from external air or moisture permeation.

The amount of oxygen included in the second sub-layer EIL2*b* may be smaller than the amount of oxygen included in the first sub-layer EIL2*a*.

The first sub-layer EIL2*a* and the second sub-layer EIL2*b* may be formed through a deposition process.

For example, a gas for forming each sub-layer is injected, and the gas may pass through a plasma gas and be deposited.

The radio frequency (RF) power of the chamber power source used to generate the above-described plasma gas may be different in case that forming the first sub-layer EIL2*a* and the second sub-layer EIL2*b*.

For example, the RF power used to form the first sub-layer EIL2*a* may be less than the RF power used to form the second sub-layer EIL2*b*.

For example, RF power of 2000 W to 3000 W or less may be used to form the first sub-layer EIL2*a*, and RF power of 6000 W to 9000 W or less may be used to form the second sub-layer EIL2*b*.

The RF power used to form the first sub-layer EIL2*a* may be one-third of the RF power used to form the second sub-layer EIL2*b*.

Additionally, the internal pressure of the chamber used in the deposition process of the first sub-layer EIL2*a* may be different from the internal pressure of the chamber used in the deposition process of the second sub-layer EIL2*b*.

The internal pressure of the chamber used in the deposition process of the first sub-layer EIL2*a* may be greater than the internal pressure of the chamber used in the deposition process of the second sub-layer EIL2*b*.

The internal pressure of the chamber used in the deposition process of the first sub-layer EIL2*a* may be about 1.8 Torr or more.

The internal pressure of the chamber used in the deposition process of the second sub-layer EIL2*b* may be in a range of about 1.5 Torr to about 1.7 Torr.

Since the first sub-layer EIL2*a* and the second sub-layer EIL2*b* are manufactured under different conditions (for example, different sizes of RF power and different sizes of gas pressure), the density of the first sub-layer EIL2*a* the densities of and the second sub-layer EIL2*b* may be different.

For example, the film density of the second sub-layer EIL2*b* may be higher than that of the first sub-layer EIL2*a*.

For example, the film density of the first sub-layer EIL2*a* may be 1.8 $g/cm^3$ or less, and the film density of the second sub-layer EIL2*b* may be 1.99 $g/cm^3$ to 2.0 $g/cm^3$.

Due to this density difference, although the first sub-layer EIL2*a* and the second sub-layer EIL2*b* have the same material and the same chemical composition ratio, the refractive index of the first sub-layer EIL2*a* and the second sub-layer EIL2*b* may be different.

The refractive index of the first sub-layer EIL2*a* may be about 1.84 or less.

The first sub-layer EIL2*a* according to an embodiment may include voids therein, and the voids included in the first sub-layer EIL2*a* may be more than the voids included in the second sub-layer EIL2*b*.

If the amount of pores included in the first sub-layer EIL2*a* is greater than the amount of pores included in the second sub-layer EIL2*b*, the film density of the first sub-layer EIL2*a* may be lowered, and the film density of the first sub-layer EIL2*a* may be lowered, and the film density may be lowered, resulting in improved hygroscopicity.

The thickness of the first sub-layer EIL2*a* may be smaller than the thickness of the second sub-layer EIL2*b*.

For example, the thickness of the first sub-layer EIL2*a* may be in a range of about 800 angstroms to about 1200 angstroms, or in a range of about 800 angstroms to about 1000 angstroms.

The thickness of the second sub-layer EIL2*b* may be in a range of about 6000 angstroms to about 7000 angstroms.

The moisture adsorption amount (molecule/$cm^2$) of the first sub-layer EIL2*a* may be greater than that of the second sub-layer EIL2*b*.

For example, the moisture adsorption amount of the first sub-layer EIL2*a* may be $1\times10^{15}$ molecule/$cm^2$ or more.

Additionally, in case that reliability evaluation is performed at 85 degrees/85% 500 hr, the stress in the tensile direction of the first sub-layer EIL2*a* may be 30 MPa or more.

The upper surface of the organic encapsulation layer EOL according to an embodiment may include a plurality of protrusions as shown in FIG. 6.

The upper surface of the organic encapsulation layer EOL may have an uneven surface.

The irregularities included in the organic encapsulation layer EOL may refer to protrusions remaining through removal of the remaining film in the ashing process of the second inorganic encapsulation layer EIL2.

The first sub-layer EIL2*a* disposed on the upper surface of the organic encapsulation layer EOL may cover the irregularities of the organic encapsulation layer EOL.

Additionally, the upper surface of the first sub-layer EIL2*a* may be formed to be uneven and have irregularities.

In case that the first sub-layer EIL2*a* and the second sub-layer EIL2*b* are formed on the unevenness of the above-mentioned organic encapsulation layer EOL, steps may occur, seams may occur in some areas, and infiltration of outside air or moisture may occur through the seam.

Accordingly, outside air or moisture may penetrate near the above-mentioned irregularities, pass through the second sub-layer EIL2*a* and the first sub-layer EIL2*a*, and reach the second electrode E2.

The second electrode E2 may be oxidized by external air or moisture, resulting in spot defects (for example, gray dark spots (GDS)).

However, the above-described first sub-layer EIL2*a* may have the property of absorbing external air or moisture.

The first sub-layer EIL2*a* may serve to trap external air or moisture introduced into the second inorganic encapsulation layer EIL2.

Therefore, the first sub-layer EIL2*a* according to an embodiment may improve the reliability of the display device by blocking a moisture permeation path caused by external air or moisture.

Additionally, the first sub-layer EIL2*a* may protect the organic encapsulation layer EOL from being damaged by plasma gas.

If the first sub-layer EIL2*a* does not protect the surface of the organic encapsulation layer EOL, the C—O bond disposed on the surface of the organic encapsulation layer EOL is broken, causing oxygen outgassing and spot-like dark points, and this may reduce the reliability of the display device.

The second sub-layer EIL2*b* may serve as a barrier to prevent penetration of external air or moisture.

Hereinafter, examples and comparative examples will be looked at with reference to FIGS. 7 to 9.

Figure 7:
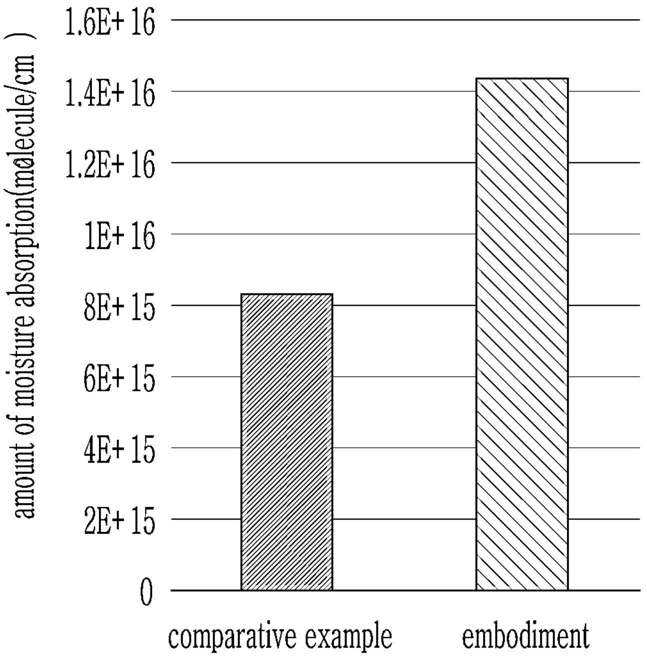
FIG. 7 is a graph showing the amount of moisture adsorption according to embodiments and comparative examples.
Figure 8:
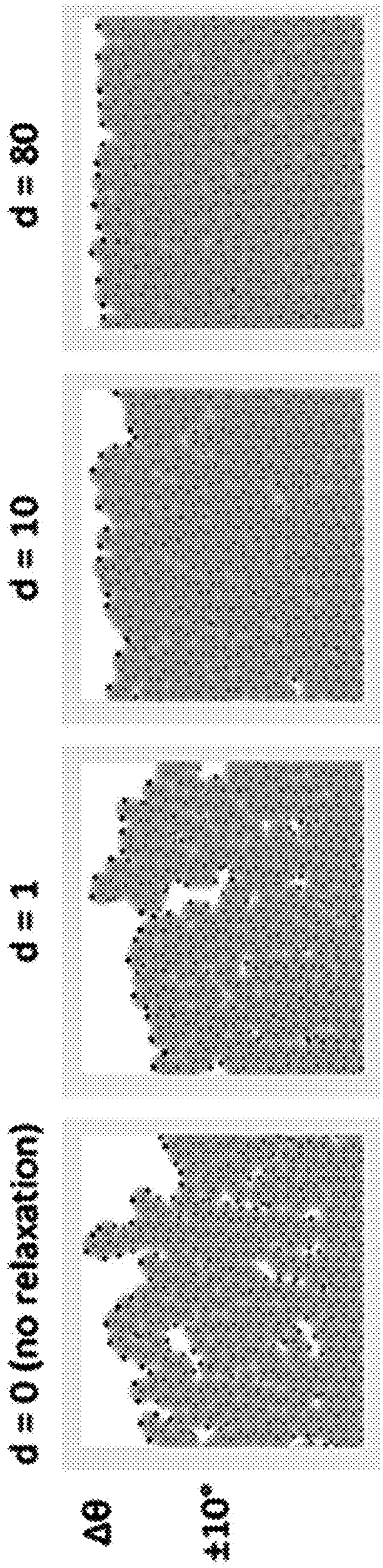
FIG. 8 is an image showing film density according to energy used in the process of forming an inorganic encapsulation layer.
Figure 9:
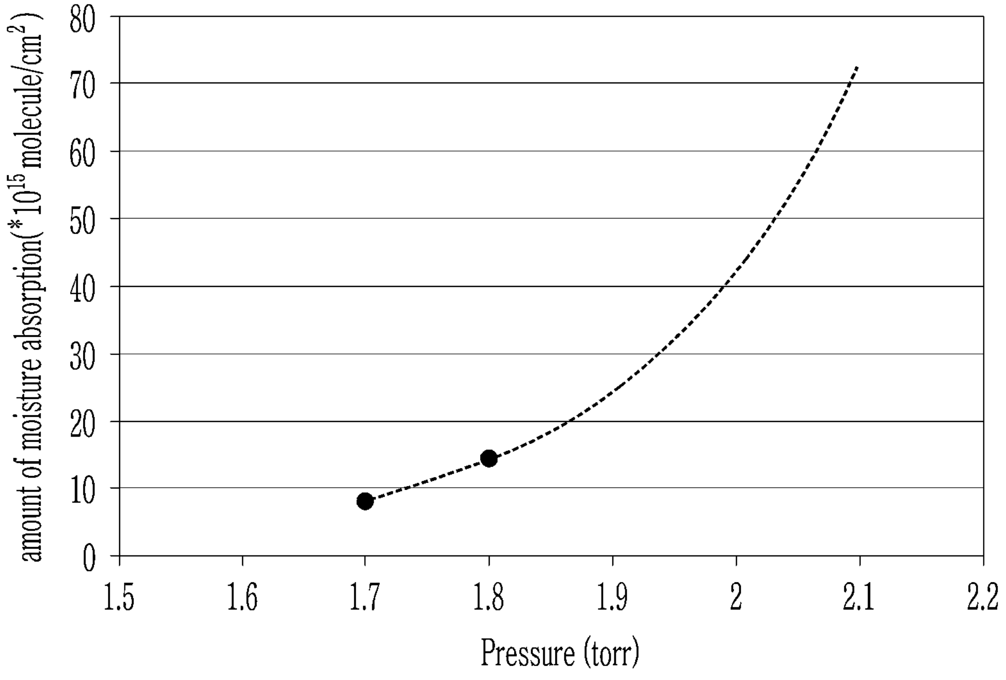
FIG. 9 is a graph showing the amount of moisture adsorption according to pressure conditions in the process of forming the inorganic encapsulation layer.

FIG. 7 is a graph showing the amount of moisture adsorption according to embodiments and comparative examples, FIG. 8 is an image showing film density according to energy used in the process of forming the inorganic encapsulation layer, and FIG. 9 is a graph showing the amount of moisture adsorption according to the examples and comparative examples; this shows the amount of moisture adsorption according to the pressure conditions of the process.

The characteristics of the first sub-layer according to the comparative example and the embodiment will be described with reference to FIG. 7 and Table 1 below.

The comparative example is a case where the first sub-layer was manufactured under a pressure condition of about 1.7 Torr, and the example is a case where the first sub-layer was manufactured under a pressure condition of about 1.8 Torr.

Other process conditions are the same.

Referring to FIG. 7 and Table 1 below, it was confirmed that in the case of the first sub-layer manufactured according to the example, the film density was reduced and the moisture adsorption amount was improved by about 1.72 times.

According to the first sub-layer manufactured according to the embodiment, oxidation in the second electrode may be prevented by absorbing external air or moisture.

TABLE 1

| Analysis Method | Unit | Comparative Example | Embodiment |
|---|---|---|---|
| TDS (Thermal Desorption Spectroscopy) | Moisture absorption amount (molecule/$cm^2$) | $8.3 \times 10^{15}$ | $1.43 \times 10^{16}$ |
| XRR (density) | XRR ($g/cm^3$) | 1.66 | 1.50 |
| Ellipsometer (Optical Measuring Device) | refractive index RI (Refractive Index) | 1.85 | 1.84 |

Also, referring to Table 2, as a result of a reliability evaluation conducted for 500 hours in a high-temperature and high-humidity environment of 85/85%, 10 spot defects (GDS defects) occurred in the comparative example, and no spot defects occurred in the example.

TABLE 2

| Reliability Evaluation | Time | Inspector's Detection | Comparative Example | Embodiment |
|---|---|---|---|---|
| 85° C./85% (high temperature/high humidity) | 500 hr | Number of GDS occurrences EA | 10 | 0 |

FIG. 8 is an image of an inorganic layer as the deposition energy of the sub-layer increases from left to right.

As shown in FIG. 8, it may be seen that as the power (or energy) decreases in the deposition process of the first sub-layer and the second sub-layer, the amount of voids contained in each layer increases and the film density decreases.

This is because the grains of the inorganic material may not grow sufficiently due to the supply of relatively small energy, and may form defects or voids.

In this way, in case that the first sub-layer is formed through a deposition process with relatively low power, it may be seen that the amount of pores included in the sub-layer increases, and the property of absorbing external air or moisture is improved.

Referring to FIG. 9, it was confirmed that as the pressure applied in the process of forming the sub-layer increased, the amount of moisture adsorption of the sub-layer increased.

Therefore, according to an embodiment, the thickness of the sub-layer is increased, the pressure of the process of manufacturing the sub-layer is increased, or the power is reduced to increase the pores included in the sub-layer and to improve the moisture absorption characteristic of external air or moisture, by improving the display device, it is possible to provide a display device that prevents spot defects (for example, GDS) from occurring.

Although embodiments have been described in detail above, the scope of the disclosure is not limited thereto, and various modifications and improvements made by those skilled in the art using the concepts of the disclosure and as defined in the following claims are also possible within the scope of the disclosure.

What is claimed is:

1. A display device, comprising:

a transistor disposed on a substrate;

a light emitting diode electrically connected to the transistor;

a first inorganic encapsulation layer disposed on the light emitting diode;

an organic encapsulation layer disposed on the first inorganic encapsulation layer;

a second inorganic encapsulation layer disposed on the organic encapsulation layer, wherein the second inorganic encapsulation layer comprises:

a first sub-layer disposed on the organic encapsulation layer; and a second sub-layer disposed on the first sub-layer, a density of the first sub-layer is lower than a density of the second sub-layer, and the first sub-layer has a thickness in a range of about 800 angstroms to about 1200 angstroms.

2. The display device of claim 1, wherein the second sub-layer has a thickness in a range of about 6000 angstroms to about 7000 angstroms.

3. The display device of claim 1, wherein the first sub-layer and the second sub-layer comprise a same material.

4. The display device of claim 3, wherein the first sub-layer further includes oxygen (O).

5. The display device of claim 3, wherein an amount of oxygen included in the first sub-layer is greater than an amount of oxygen included in the second sub-layer.

6. The display device of claim 1, wherein a moisture adsorption amount of the first sub-layer is greater than a moisture adsorption amount of the second sub-layer.

7. The display device of claim 1, wherein an amount of voids included in the first sub-layer is greater than an amount of voids included in the second sub-layer.

8. The display device of claim 1, wherein the first inorganic encapsulation layer includes silicon oxynitride, and the first sub-layer and the second sub-layer include silicon nitride.

9. The display device of claim 1, wherein an upper surface of the organic encapsulation layer includes an uneven surface.

10. The display device of claim 9, wherein the first sub-layer covers the uneven surface of the upper surface of the organic encapsulation layer.

11. The display device of claim 10, wherein an upper surface of the first sub-layer includes an uneven surface.

12. A display device, comprising:
- a transistor disposed on a substrate;
- a light emitting diode electrically connected to the transistor;
- a first inorganic encapsulation layer disposed on the light emitting diode;
- an organic encapsulation layer disposed on the first inorganic encapsulation layer;
- a second inorganic encapsulation layer disposed on the organic encapsulation layer, wherein
- the second inorganic encapsulation layer comprises:
  - a first sub-layer disposed on the organic encapsulation layer; and
  - a second sub-layer disposed above the first sub-layer,
- a density of the first sub-layer is lower than a density of the second sub-layer, and
- a moisture absorption amount of the first sub-layer is about $1\times10^{15}$ molecule/$cm^2$ or more.

13. The display device of claim 12, wherein the first sub-layer has a thickness in a range of about 800 angstroms to about 1200 angstroms.

14. The display device of claim 13, wherein the second sub-layer has a thickness in a range of about 6000 angstroms to about 7000 angstroms.

15. The display device of claim 12, wherein the first sub-layer and the second sub-layer comprise a same material.

16. The display device of claim 12, wherein the first sub-layer further includes oxygen (O).

17. The display device of claim 12, wherein an amount of voids included in the first sub-layer is greater than an amount of voids included in the second sub-layer.

18. The display device of claim 12, wherein
- the first inorganic encapsulation layer includes silicon oxynitride, and
- the first sub-layer and the second sub-layer include silicon nitride.

19. The display device of claim 12, wherein
- an upper surface of the organic encapsulation layer includes an uneven surface, and
- the first sub-layer covers the uneven surface of the upper surface of the organic encapsulation layer.

20. The display device of claim 12, wherein an upper surface of the first sub-layer includes an uneven surface.

* * * * *